(12) United States Patent
Figueroa et al.

(10) Patent No.: US 7,358,607 B2
(45) Date of Patent: Apr. 15, 2008

(54) SUBSTRATES AND SYSTEMS TO MINIMIZE SIGNAL PATH DISCONTINUITIES

(75) Inventors: David G. Figueroa, Mesa, AZ (US); Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 978 days.

(21) Appl. No.: 10/090,735

(22) Filed: Mar. 6, 2002

(65) Prior Publication Data
US 2003/0168737 A1    Sep. 11, 2003

(51) Int. Cl.
*H01L 23/48* (2006.01)

(52) U.S. Cl. .......................... 257/736; 257/737; 257/738; 257/735; 257/739; 257/678; 174/261; 174/262

(58) Field of Classification Search ................ 257/678, 257/736–738, 735, 739; 174/261, 262
See application file for complete search history.

(56) References Cited

U.S. PATENT DOCUMENTS

| | | | | |
|---|---|---|---|---|
| 5,451,721 A | * | 9/1995 | Tsukada et al. | 174/261 |
| 5,487,218 A | * | 1/1996 | Bhatt et al. | 29/852 |
| 5,615,477 A | * | 4/1997 | Sweitzer | 29/840 |
| 6,627,986 B2 | * | 9/2003 | Ishihara et al. | 257/690 |

* cited by examiner

Primary Examiner—Junghwa Im
(74) Attorney, Agent, or Firm—Schwegman, Lundberg & Woessner, P.A.

(57) ABSTRACT

Arrangements are used for minimizing signal path discontinuities.

11 Claims, 4 Drawing Sheets

SUBSTRATES AND SYSTEMS TO MINIMIZE SIGNAL PATH DISCONTINUITIES

FIELD

The present invention is directed to arrangements for minimizing signal path discontinuities.

BACKGROUND

Background and example embodiments of the present invention will be described using the context of processors and semiconductor layering arrangements, but practice of the present invention and a scope of the appended claims are not limited thereto.

High-speed systems require a corresponding high level of signal integrity to achieve performance requirements. A greater transmission bandwidth may be necessary for these systems than for less robust systems, so as to satisfy greater input/output (I/O) requirements. The current design of substrates used in high-performance processor systems does not facilitate an advantageous signal path which can result in maximal signal integrity.

As system frequency increases (e.g., from 533 MHz to 2.5 Gigabits/second) to meet performance demands, the effects of signal path deficiencies become more pervasive. Needed are arrangements to increase signal integrity in the signal paths.

BRIEF DESCRIPTION OF THE DRAWINGS

The foregoing and a better understanding of the present invention may become apparent from the following detailed description of example embodiments, and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Figure 1:
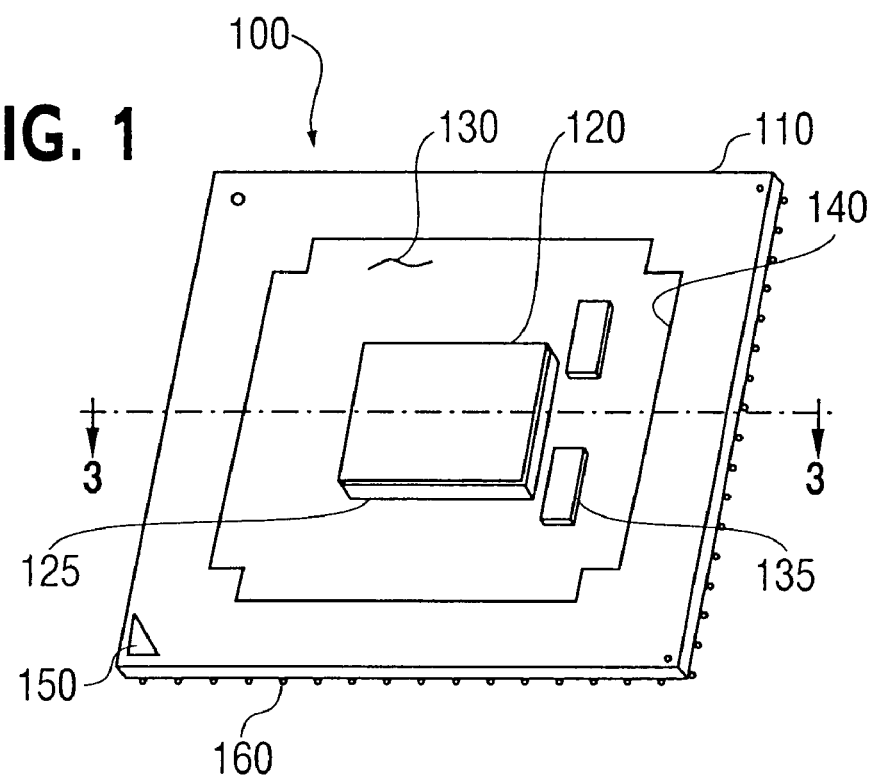
FIG. 1 shows a perspective view of an example flip chip bumped/ball grid array (FCBGA) system, such view being useful in explanation and understanding of background and example embodiments of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Example arbitrary axes (e.g., X-axis, Y-axis and/or Z-axis) may be discussed/illustrated, although practice of the present invention is not limited thereto (e.g., differing axes directions may be able to be assigned).

Well-known power/ground connections to ICs and other components may not be shown within the FIGS. for simplicity of illustration and discussion, and so as not to obscure the invention. Further, arrangements may further be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., signal paths, circuits) are set forth in order to describe example embodiments of the invention, it should be apparent to one skilled in the art that the invention can be practiced without, or with variation of, these specific details.

At this point, it is again stressed that although example embodiments of the present invention may be described using an example embodiment of a signal path travel through a processor package substrate in the context of an example FCBGA arrangement, practice of the present invention is not limited to such context. That is, practice of the present invention may have uses with other types of chips and with other types of mounting technologies (e.g., Micro-Pin Grid Array (μ-PGA) packages). In addition, embodiments of the invention are applicable to a variety of packages including organic, ceramic, and flex packages, with other types of systems, and in other types of environments (e.g., communication devices).

Turning now to detailed description, FIG. 1 shows a perspective view of an example system useful in explanation and understanding of background and example embodiments of the present invention. More particularly, FIG. 1 illustrates an integrated circuit (IC) printed circuit board (PCB) carrier package system, and more particularly, an example FCBGA system 100. FIG. 1 further illustrates an example layout of the top (primary or die) side of a substrate 110 having an example die 120 (e.g., flip-chip (FC)) mounted thereto, and still further illustrates underfill 125, die-side component area 130, die-side components 135, package keep-out area 140, and an indexing mark 150. Also shown are conductive bump/balls 160.

In such FCBGA microprocessor packaging using flip-chip design, the processor may be attached to the substrate face-down, using a BGA package with BGA connectors (e.g., conductive bumps/balls and lands). As an alternative to BGA components, a pinned substrate may be used for socketing to other socketed components. Further, the BGA or pinned package may be additionally mounted onto an interposer to facilitate interfacing with yet another component such as a receiving substrate (e.g., motherboard; not shown). An Organic Land Grid Array (OLGA) package, using a flip-chip design allows the processor to be attached to the substrate face-down for, for example, more efficient heat removal. Such FCBGA was developed for implementation of, for example, OLGA package technology processors in thin/light-weight mobile computing devices.

As further elaboration, the FIG. 1 substrate 110, may be, for example, a fiber-reinforced (FR) resin substrate with conductive (e.g., copper) intra-layers, the die 120 may be a solder-bumped FC die, and the underfill 125 may be an epoxy underfill. The die-side components 135 are optional, and may be, for example, decoupling capacitors or resistors and may be located within a die-side component area 130. The die 120 may also be located within the die-side component area 130 defined by the surrounding package keep-out area 140. The conductive bump/balls 160 may be arranged in an array, and composed of a conductive material such as a conductive polymor or lead/tin alloy. Finally, the indexing mark 150, may be a gold triangle, and serve as an index, for example, of a particular reference conductive bump/ball 160.

Figure 2:
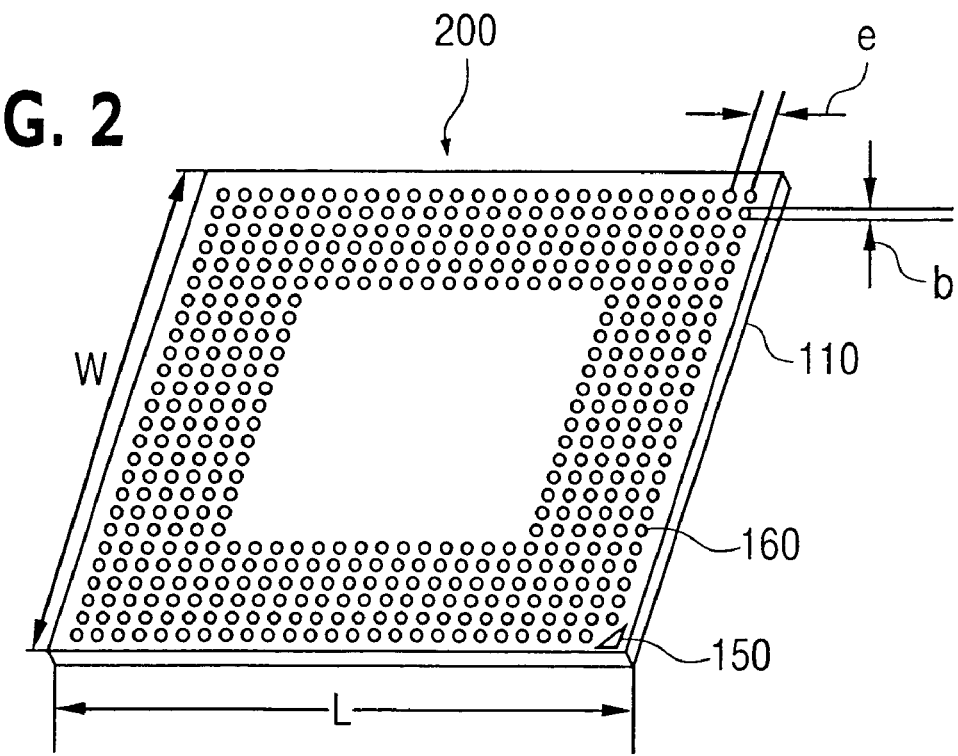
FIG. 2 is a bottom view of a FCBGA substrate of FIG. 1.

Turning next to FIG. 2, there is shown a bottom view 200 of substrate 110. More specifically, the bottom view 200 illustrates an example layout of the bottom (conductive bump/ball, or secondary) side of a substrate 110. The example conductive bump/ball 160 count may be 479 bumps/balls, with the conductive bump/balls 160 arranged in an example array of rows and columns referenced to an example indexing mark 150. An example conductive bump/ball pitch e may be 1.27 mm, and an example conductive bump/ball diameter b may be 0.78 mm. An example substrate 110 length L may be 35 mm, and an example substrate width W may be 35 mm.

Figure 3:
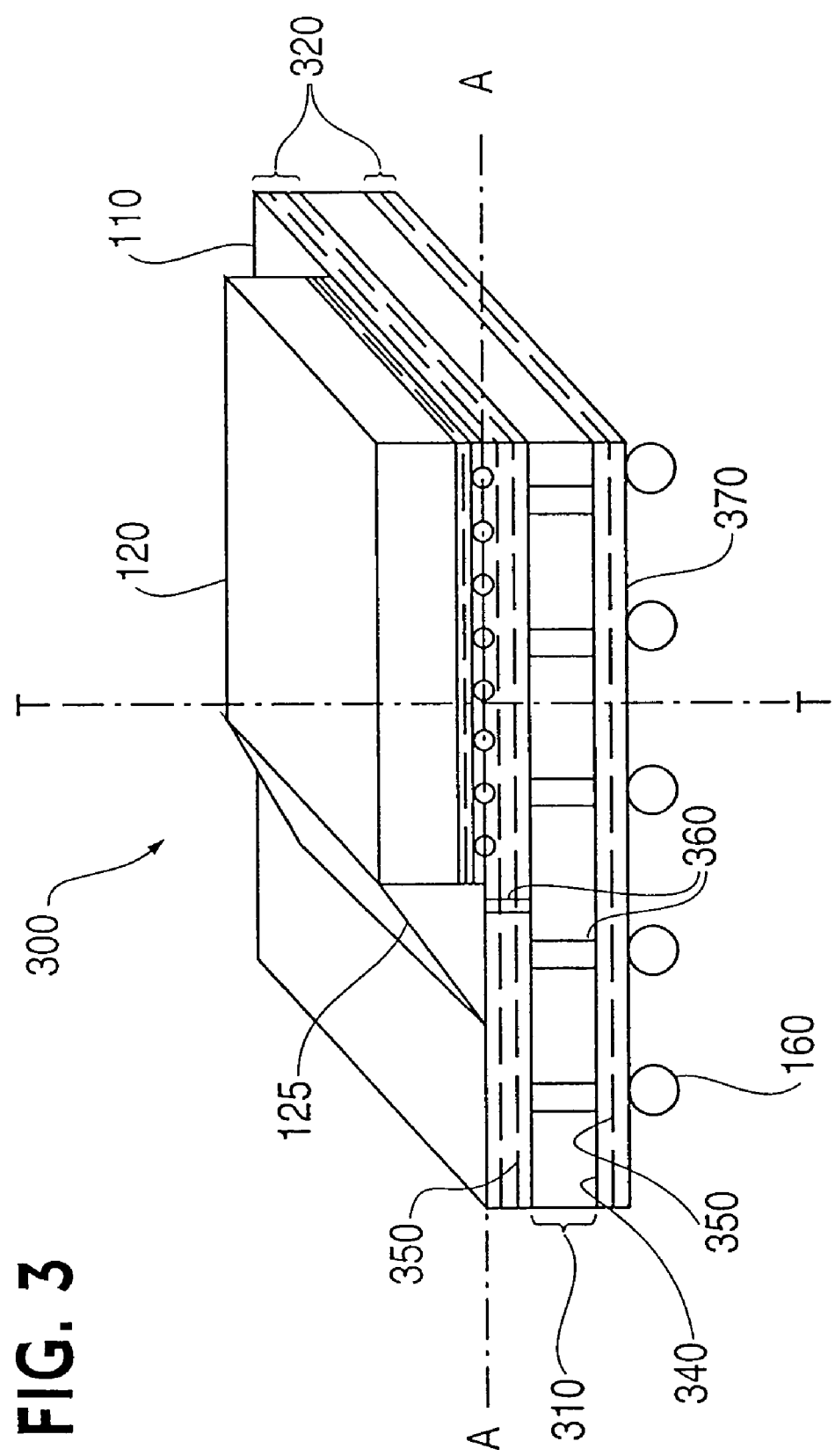
FIG. 3 is a cross-sectional side view of the example FIG. 1 FCBGA system, with a substrate layer arrangement shown in greater detail.
Figure 4:
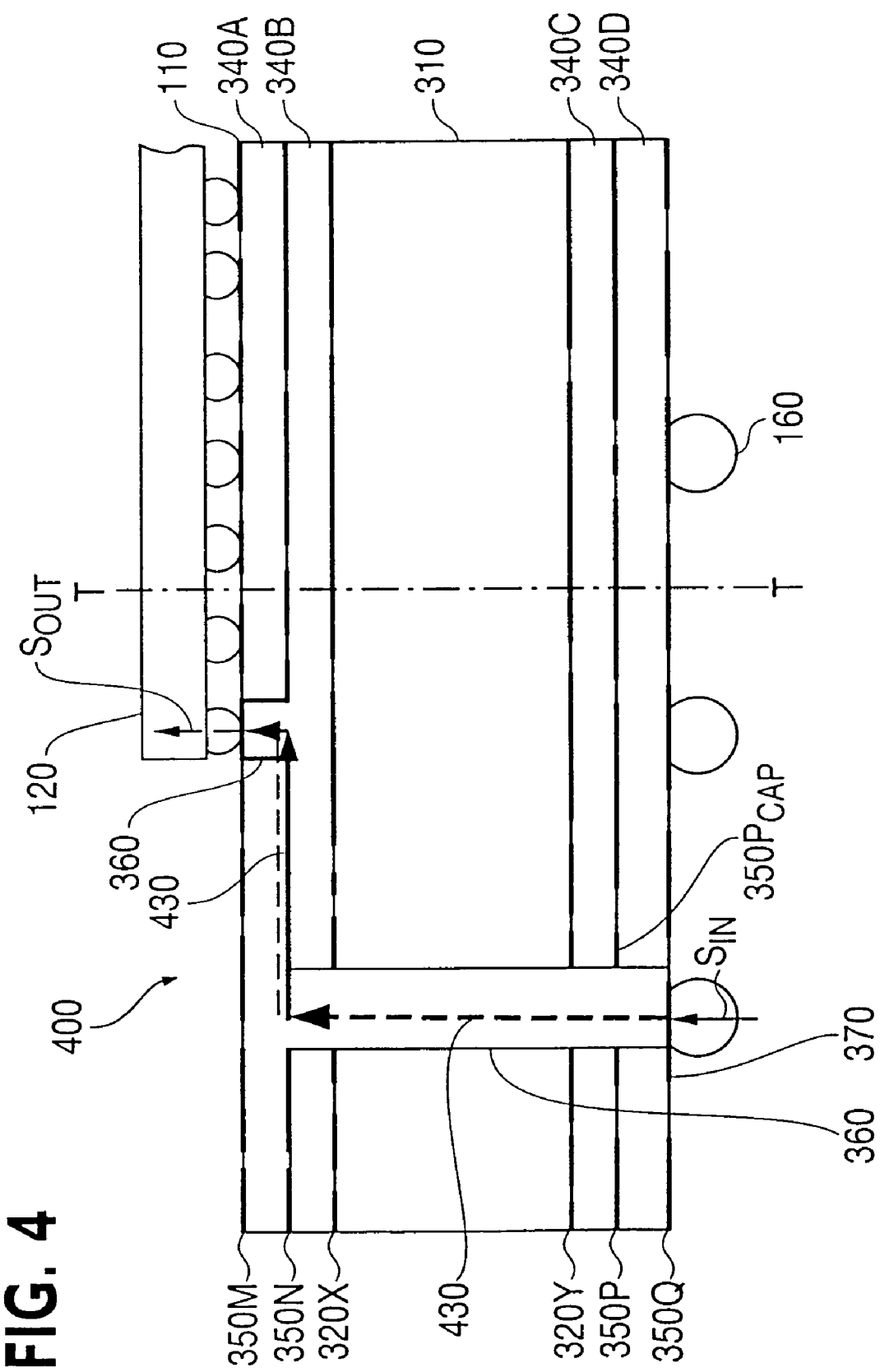
FIG. 4 is a magnified, partial cross-sectional similar to FIG. 3, but being more simplistic and further illustrating a disadvantageous example signal path through a substrate.

FIG. 3 illustrates a cross-sectional view 300 of the example FIG. 1 system as taken along the FIG. 1 axis 3-3. Such cross-sectional view 300 also illustrates a more detailed example layering of the substrate 110, spanning in an example direction T. FIG. 4 is a magnified, partial cross-sectional view 400 similar to FIG. 3 but being more simplistic and further illustrating a disadvantageous example signal path through a substrate.

Turning now to specific FIGS. 3-4 discussions, the substrate 110 may be composed of a plurality of laminate layers, some of which are dielectric material (insulator) and some of which are conductive. Alternatively, some layers may be of primarily one material (e.g., primarily dielectric), while including areas of differing material (e.g., conductive material) within such layer. To further elaborate, FIG. 4 illustrates that the example substrate 110 may be composed of a central core 310 of a dielectric material, which core 310 is bordered by a primary-side peripheral core conductive layer 320X and secondary-side peripheral core conductive layer 320Y. The arrangement further has subsequent layers "built-up" or laminated on both sides of the core.

Such laminated layers, may be dielectric layers 340A, 340B, 340C, and 340D alternating with conductive layers 350M, 350N, 350P, and 350Q. Ones of such layers may not span to the same lengths of other ones of such layers, but as shown in FIG. 3, the conductive or dielectric layers may only extend partially or disjointedly across the substrate 110. As one example, an interruption may be used to allow space for inter-layer vias, or to define an electrical path within a layer. With proper layout design (i.e., combinations of balls, layer traces, vias, etc.), a signal may be routed from any electrical component (not shown in FIG. 4) that the substrate may be mounted on, to the die 120 using various combinations/portions of the balls, layers, traces, vias, etc.

The example internal core 310 may have an example thickness of 800 microns (along the FIGS. 3-4 example direction T). The primary-side peripheral core conductive layer 320X and secondary-side peripheral core conductive layer 320Y each may have an example thickness of 14 microns.

The internal dielectric build-up layers 340B and 340C may be of an example 30 microns each in thickness, while the internal conductive build-up layers 350N and 350P may be of an example 25 microns each in thickness. Continuing, the external dielectric build-up layers 340A and 340D may be an example 30 microns in thickness, and finally the primary-side external conductive build-up layer 350M and secondary-side external conductive build-up layer 350Q may each be of an example 17 microns in thickness.

Discussion turns now to the example dashed arrow path 430 of FIG. 4, such FIG. 4 omitting a number of FIG. 3 items for sake of simplicity/clarity. That is, an example signal may travel from an electrical component (not shown; e.g., motherboard) on which the substrate 110 is mounted, through the conductive bump/balls 160, to a land 370. In the FIG. 4 arrangement, the lands are located along the secondary-side external conductive build-up layer 350Q. The signal may further travel, from the land 370 onto another portion (e.g., a trace) of the secondary-side external conductive build-up layer 350Q, and then along one or more vias 360 on a secondary side of the substrate to travel through each of the layers 340D, 350P, 340C, 320Y, 310, 320X and 340B, to arrive at the layer 350N. The signal path 430 may then travel along a trace within the layer 350N onto another via 360, and from there, onto a portion (e.g., trace, land) of the layer 350M, and then onto the die 120.

In the FIG. 4 arrangement, there may be excessive discontinuities (e.g., impedance variations, layer joints), resulting in unacceptable excessive signal differences found between a primary-side (output) signal $S_{out}$ and a secondary-side (input) signal $S_{in}$ entering the substrate 110. Such differences may include attenuation, reflections, phase-delays and induced noise.

Discussion now turns to one example discontinuity. More particularly, an example input impedance as measured at an example entry point of the substrate, may be 50 Ohms. This impedance may then be immediately reduced within the FIG. 4 arrangement to an example 30 or 35 ohms. Such represents a drastic point-to-point impedance variation along the signal path, which may contribute to degrade the signal's quality.

One possible explanation for the impedance drop might be that ones of the lands 370 (e.g., associated with the signal input point to the substrate 110) may act as a first plate of a parasitic capacitor, while closely opposing portions (e.g., 350P$_{cap}$) of neighboring conductive layers may act as a second plate of the parasitic capacitor. Such parasitic capacitance may very well result in an impedance discontinuity close to the input point of the signal path 430, and this discontinuity may very well be in excess of a permissible impedance variation, of, for example, +/−10 Ohms. That is, as a signal travels point-to-point along the path, it may experience an impedance discontinuity or variation which may be unacceptable. As negative effects, the impedance variation may result in excessive levels of signal reflections which become noise along the signal path and within the system. Each physical joint between ones of the various balls, layers, traces, vias, etc., used to form the signal path may also represent a signal path discontinuity and affect signal integrity. For example, neighboring balls, layers, traces, vias, etc., may very well have differing impedances (e.g., resistances) from one another as such conductive members will have been formed at different times (with at least slightly differing materials) during the manufacturing process. Further, due to mis-registrations, contaminants, etc., an electrical conduction path at a joint between neighboring members may be less than perfect. Again, each discontinuity has the potential to negatively affect signal integrity and therefore limit a performance capability of the system. As a result of the foregoing, it can be seen that the FIG. 4 arrangement may result in an unacceptable level of system performance.

Figure 5:
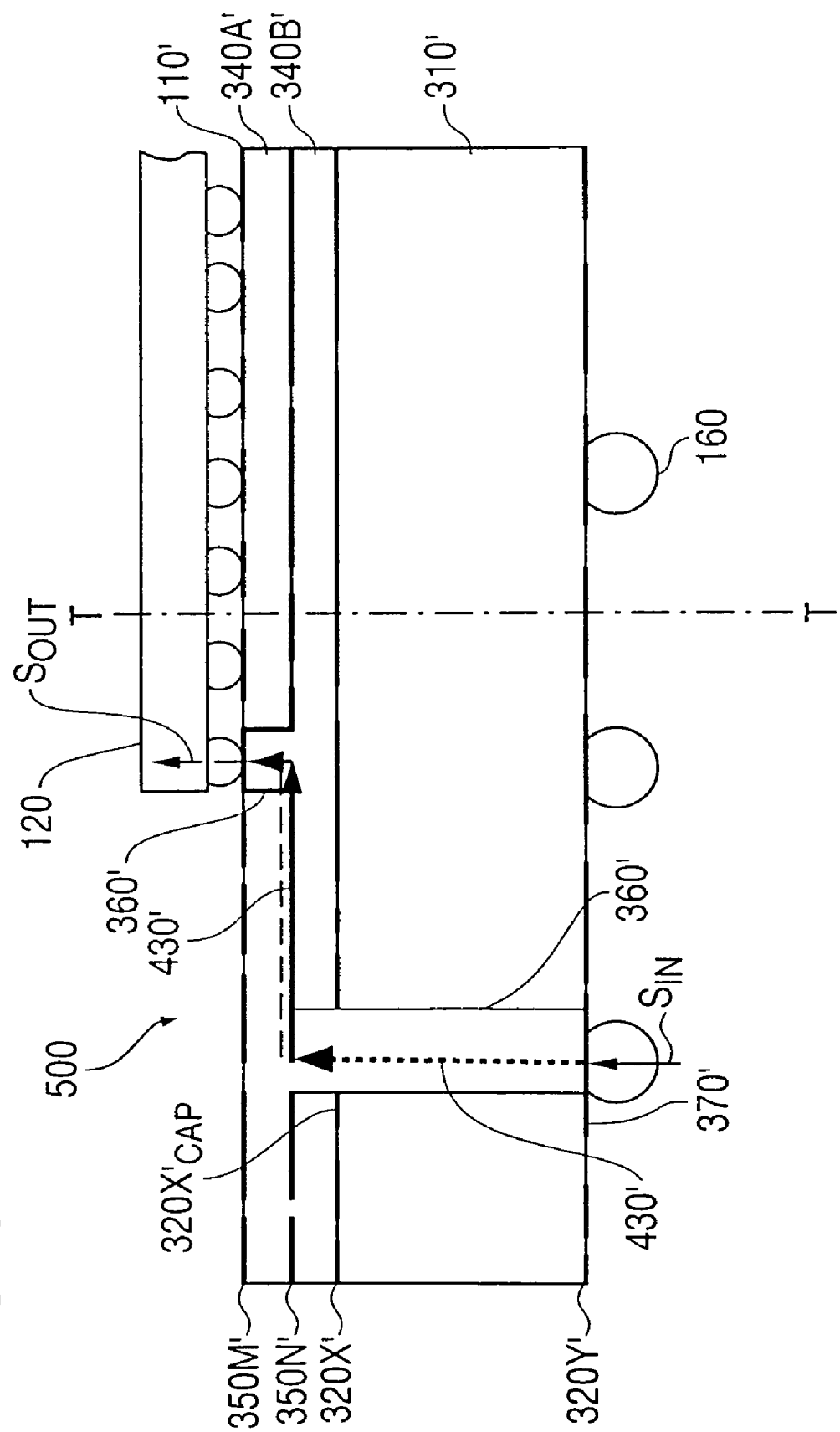
FIG. 5 is a magnified, partial cross-sectional side-view similar to FIG. 4, with build-up or laminate layers only on a die (primary) side of the substrate as one example embodiment of the present invention.

FIG. 5 is a side view 500 similar to that of FIG. 4, but showing an example embodiment of the present invention. This example embodiment provides a differently-arranged substrate 110', designed to attempt to minimize signal path discontinuities (e.g. variations in impedance). More particularly, the FIG. 5 embodiment has, for example, a core 310' and multiple build-up layers 320X', 340B', 350N' 340A', 350M' on the primary-side, and a lesser number of build-up layers, such as only one peripheral core conductive layer 320Y', on the substrate 110's secondary side (e.g., core bottom side). That is, the build-up layers 340C, 350P, 340D, 350Q that were present on the bottom side of the core 310 in the FIG. 4 arrangement have been reduced, or eliminated. Practice of embodiments of the present invention is not limited to this specific arrangement, and instead, other example embodiments may be where the substrate mounting-side of the arrangement has one-quarter, one-third or even one-half a number of conductive layers as opposed to a number of the primary-side of the package.

In the example embodiment, the lands 370' may now be located as part of the bottom peripheral core conductive layer 320Y'. That is, in the FIG. 5 example, there is a single (one) conductive layer on the secondary side of the core, while there remains a plurality of conductive layers on the primary (die) side of the core.

An example advantageous signal path may follow the example FIG. 5 dashed-line arrow paths 430', i.e., from an electrical component (not shown) on which the substrate 110 is mounted, through the conductive bump/balls 160 to the lands 370' (now located as part of the bottom conductive core layer 320Y'). The signal may further travel along other portions (e.g., land, trace) of the core conductive layer 320Y' onto a via 360' and through the core 310', layer 320X', layer 340B', and then travel onto the layer 350N'. The signal may then transition onto a second via 360' and onto a portion (e.g., land, trace) of the layer 350M', and finally, onto the die 120.

Such arrangement may reduce the capacitance between a signal at the land 370' and another conductive layer, because the closest parallel, conductive layer which may attempt to act as a secondary plate of a parasitic capacitor may be a portion $320X'_{cap}$ of the opposite peripheral core layer 320X'. Given that the thickness of the core 310' may be much greater than the thickness of any one of the previously described FIG. 4 build-up layers 340C, 340D, the resultant capacitance would be substantially reduced (by increased separation). The present embodiment therefore reduces an impedance, and proper design of the layering arrangements may thus be used to improve continuity (e.g., impedance continuity) along the signal path.

To summarize the above embodiment, the capacitance may be reduced in the signal path, resulting in a lesser impedance deviation, and allowing for higher signal performance. More particularly, capacitance is inversely proportional to the distance between the two example conducting surfaces (e.g., land position and any opposing conductive layer in the signal path). In the FIG. 4, arrangement this distance is approximately the distance between the land 370 on the secondary-side external conductive build-up layer 350Q and the internal conductive build-up layer 350P. Note that this distance is the thickness of the external dielectric build-up layer 340D having an example thickness of 30 microns. In the FIG. 5 example embodiment, an analogous capacitance will be lower as it is proportional to the distance between the land 370' position on the bottom peripheral core layer 320Y', and the opposite primary-side conductive peripheral core layer 320X'. Note that this distance is the core 310 thickness of an example 800 microns.

With such increased distance, the capacitance may be reduced by an example factor of 30/800 or 0.04 (e.g., by 96%). For example, a relative capacitance may be reduced from an example 0.5 picofarad (FIG. 4) to an example 0.025 picofarad (FIG. 5). With such a reduced capacitance, the impedance discontinuity (i.e., variation along the signal path) may be subsequently reduced and signal integrity improved.

A further advantage of the FIG. 5 arrangement is as follows. More particularly, it was previously mentioned with respect to the FIG. 4 that a significant number of conductive signal path layers, traces, vias, etc. may be used to define a signal path through the FIG. 4 secondary side layers 340Q, 340D, 350P, 340C, and 320Y, before the signal path even arrives to transition through the core 310. As mentioned previously, the physical joints between such conductive members represent a potential signal path discontinuity. As the FIG. 5 example embodiment eliminates a complexity of lamination layering on the secondary side of the substrate, i.e., eliminates layers 340Q, 340D, 350P and 340C, it can be seen that there is a corresponding reduction in a number of physical joints within the signal path on the secondary side of the substrate. With a lesser number of physical joints, signal path discontinuities are minimized, advantageously leading to improved signal integrity and higher system performance.

In concluding, in such FIG. 5 example embodiment, there may occur a lesser variation between a mounting-component-side signal entering the bottom of the substrate 110, and the primary-side signal leaving the substrate to enter the die 120. While the example embodiment was described as reducing any impedance and physical joint discontinuities at an input/output of a secondary side of the substrate 110', practice of the present invention can just as easily be applied to reduce discontinuities at an input/output of a primary (die) side, or even within internal layers of the substrate. For example, if a localized impedance discontinuity is determined to exist along an internal signal path as a result of parasitic capacitance between ones of the internal layers (e.g., neighboring vertical vias), modifications (e.g., increased separation distance; changing of a material therebetween to one having a differing permittivity) may be used to reduce the localized impedance discontinuity to within a predetermined acceptable range.

As advantages, practice of embodiments of the present invention utilize standard layer manufacturing, with layers each being made using any of (non-exhaustive) example mold, stamp, etch, extrude, or deposit processes. The layer arrangements may be designed to be capable of withstanding currents, temperatures, stresses, etc., of at least normal system operation. The present invention is applicable to any type of processor system substrate (e.g., ceramic, CPGA, etc.), and to both single-ended and differential signal systems. Also, the present invention is not limited to signal path conduction implementation with balls, lands, pads, traces and vias, and instead, may also be implemented with differing signal paths (e.g., conductive wires).

Implementation of embodiments of the present invention may very find specific use with respect to Next Generation Input/Output (NGIO) hardware. More particularly, NGIO specifications/technology set forth a high performance distributed network environment using an NGIO switched fabric (e.g., collection of links, switches and/or switch elements connecting a number of host systems and I/O units). Embodiments of the present invention may be useable to construct the high performance links, switches, switch elements, channel adapters, etc., requiring high signal path integrity to satisfy NGIO or any other future technology's stringent requirements. One example would be an NGIO host channel adapter (HCA) chip or chipset package constructed utilizing an embodiment of the present invention to provide layered wiring though a layered substrate, with a resultant electrical conduction path having substantial impedance continuity maintained within a predefined limit therealong. Information with respect to NGIO can be found within the "*Next Generation Input/Output (NGIO) Specification*" as set forth by the NGIO Forum on Jul. 20, 1999, and also the "*Next Generation I/O Link Architecture Specification: HCA Specification, Revision* 1.0" as set forth by NGIO Forum on May 13, 1999.

In concluding, reference in the specification to one embodiment, an embodiment, an example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that may fall within the spirit and scope of the principles of this invention. More particularly, reasonable variations and modifications are possible in the component parts and/or arrangements of the subject combination arrangement within the scope of the foregoing disclosure, the drawings and the appended claims, without departing from the spirit of the invention. In addition to variations and modifications in the component parts and/or arrangements, alternative uses may also be apparent to those skilled in the art.

For example, practice of the present invention is not limited to the above-mentioned reduction in capacitance, and a non-exhaustive listing of other benefits of deletion of build-up layers may be a decrease in signal path resistance or an number of inter-layer joints. With regard to the substrate arrangement, the practice of the present invention is not limited to the other FIG. 5 example layering arrangement, but instead, other arrangements may likewise be provided. For example, build-up layers may be eliminated on both sides of the core. In addition, the continuity of the signal may be improved, for example, by a non-exhaustive listing of: modification of dielectric permittivity of non-conductive layers so capacitance is reduced without physical modification of number of layers. Accordingly, any one or more of: reducing a number of layers; increasing a separation distance between impedance-interacting (e.g., capacitive) layers; and, a strengthening of dielectric permittivity of material disposed between impedance interacting layers, may be used anywhere along an electrical conducting path of a layering arrangement, so as to keep an impedance (Z) variation from neighboring point to neighboring point along the path, to below a predetermined value or percentage (e.g., 0 to 10 Ohms, 15 Ohms, or 0 to 10%, 15%, 20% etc.).

What is claimed is:

1. A substrate to mount a die having at least one input signal terminal, the substrate keeping an impedance variation between an input signal entering the substrate from a receiving substrate and an output signal provided to the at least one input terminal below a predetermined value, the substrate comprising:
   a dielectric core member having an approximate thickness of 800 microns;
   a first plurality of dielectric lamination layers on a first side of the dielectric core member, each having an approximate thickness of 30 microns, and wherein the dielectric core member comprises material of different dielectric permittivity in comparison to a permittivity of material of the dielectric lamination layers;
   a second plurality of conductive layers on the first side of the dielectric core member, each having an approximate thickness of 25 microns, and including at least one connector on a first surface of an uppermost one of the second plurality of conductive layers to couple to the at least one input signal terminal of the die; and
   a single conductive layer on a second side of the dielectric core member, having an approximate thickness of 17 microns, wherein the single conductive layer comprises at least one land to couple to the input signal from the receiving substrate.

2. The substrate as claimed in claim 1, wherein the receiving substrate comprises one of an interposer or a motherboard.

3. The substrate as claimed in claim 1, wherein the predetermined value is within the range of ±10 ohms.

4. A system comprising:
   a die having a plurality of terminals, including at least one input signal terminal;
   a receiving substrate having a plurality of terminals, including at least one terminal to provide an input signal;
   a layered substrate including
      a dielectric core member;
      a first plurality of dielectric lamination layers on a first side of the dielectric core member, wherein the dielectric core member comprises material of different dielectric permittivity in comparison to a permittivity of material of the first plurality of the dielectric lamination layers;
      a second plurality of conductive layers on the first side of the dielectric core member, including at least one connector on a first surface of an uppermost one of the second plurality of conductive layers, the connector being coupled to the at least one input signal terminal; and
      a single conductive layer on a second side of the dielectric core member, wherein the single conductive layer comprises at least one land coupled to the input signal from the receiving substrate.

5. The system as claimed in claim 4, wherein the receiving substrate comprises one of an interposer or a motherboard.

6. The system as claimed in claim 4, wherein the predetermined value is within the range of ±10 ohms.

7. The system as claimed in claim 4, wherein the dielectric core member has an approximate thickness of 800 microns, wherein each of the first plurality of dielectric lamination layers has an approximate thickness of 30 microns, wherein each of the second plurality of conductive layers has an approximate thickness of 25 microns, and wherein the single conductive layer has an approximate thickness of 17 microns.

8. A substrate to mount a die having at least one input signal terminal, the substrate keeping an impedance variation between an input signal entering the substrate from a receiving substrate and an output signal provided to the at least one input terminal below a predetermined value, the substrate comprising:
- a dielectric core member;
- a first plurality of dielectric lamination layers on a first side of the dielectric core member, wherein the dielectric core member comprises material of different dielectric permittivity in comparison to a permittivity of material of the first plurality of dielectric lamination layers;
- a second plurality of conductive layers on the first side of the dielectric core member, including at least one connector on a first surface of an uppermost one of the second plurality of conductive layers to couple to the at least one input signal terminal of the die; and
- a single conductive layer on a second side of the dielectric core member, wherein the single conductive layer comprises at least one land to couple to the input signal from the receiving substrate.

9. The substrate as claimed in claim 8, wherein the receiving substrate comprises one of an interposer or a motherboard.

10. The substrate as claimed in claim 9, wherein the predetermined value is within the range of ±10 ohms.

11. The substrate as claimed in claim 10, wherein the dielectric core member has an approximate thickness of 800 microns, wherein each of the first plurality of dielectric lamination layers has an approximate thickness of 30 microns, wherein each of the second plurality of conductive layers has an approximate thickness of 25 microns, and wherein the single conductive layer has an approximate thickness of 17 microns.

* * * * *

UNITED STATES PATENT AND TRADEMARK OFFICE
CERTIFICATE OF CORRECTION

PATENT NO. : 7,358,607 B2 Page 1 of 1
APPLICATION NO. : 10/090735
DATED : April 15, 2008
INVENTOR(S) : Figueroa et al.

It is certified that error appears in the above-identified patent and that said Letters Patent is hereby corrected as shown below:

In column 8, line 56, in Claim 4, delete "terminal;" and insert -- terminal of the die; --, therefor.

In column 9, line 17, in Claim 8, after "plurality of" insert -- the --.

Signed and Sealed this

Fifteenth Day of July, 2008

JON W. DUDAS
*Director of the United States Patent and Trademark Office*